(12) United States Patent  
Kim et al.

(10) Patent No.: US 8,988,130 B2
(45) Date of Patent: Mar. 24, 2015

(54) METHOD AND APPARATUS FOR PROVIDING THROUGH SILICON VIA (TSV) REDUNDANCY

(75) Inventors: Jonghae Kim, San Diego, CA (US); Feng Wang, San Diego, CA (US); Matthew Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1099 days.

(21) Appl. No.: 12/468,908

(22) Filed: May 20, 2009

(65) Prior Publication Data

US 2010/0295600 A1 Nov. 25, 2010

(51) Int. Cl.
*H03K 17/00* (2006.01)
*H03K 19/003* (2006.01)
*H01L 25/065* (2006.01)

(52) U.S. Cl.
CPC ...... *H03K 19/00392* (2013.01); *H01L 25/0657* (2013.01); *H01L 2225/06513* (2013.01); *H01L 2225/06541* (2013.01); *H01L 2225/06596* (2013.01); *H01L 2924/0002* (2013.01)
USPC .......................................... 327/365; 257/621

(58) Field of Classification Search
CPC ............. H03K 17/693; H03K 17/063; H03K 17/08142; H03K 17/6871; H03K 2217/0036
USPC .......... 257/621, 698, 774, 777, 778; 438/667, 438/459; 327/365
See application file for complete search history.

(56) References Cited

U.S. PATENT DOCUMENTS

| | | | |
|---|---|---|---|
| 6,562,680 | B1 | 5/2003 | Asakawa |
| 7,999,367 | B2 | 8/2011 | Kang et al. |
| 2003/0197515 | A1 | 10/2003 | Ishigaki |
| 2006/0126369 | A1* | 6/2006 | Raghuram ...................... 365/51 |
| 2009/0039492 | A1* | 2/2009 | Kang et al. .................... 257/686 |
| 2009/0091333 | A1 | 4/2009 | Chung et al. |

FOREIGN PATENT DOCUMENTS

| | | |
|---|---|---|
| CN | 1832165 A | 9/2006 |
| JP | 2003309183 A | 10/2003 |
| JP | 2004327474 A | 11/2004 |
| JP | 2005122823 A | 5/2005 |

(Continued)

OTHER PUBLICATIONS

Chung Hoe Ju ; Lee Hoon ; Lee Jung Bae, "Stacked Semiconductor Device With a Vertical Input and Output Line and a Configuration Method Thereof, Repairing a Fail of the Vertical Input and Output Lines", Apr. 8, 2009.*

(Continued)

*Primary Examiner* — Diana J Cheng
(74) *Attorney, Agent, or Firm* — Donald D. Min (57) ABSTRACT

An apparatus includes a first die having a first bus, a second die having a second bus stacked on the first die, a plurality of through silicon vias connecting the first bus to the second bus, and first control logic for sending data to identified ones of the plurality of through silicon vias. Also, optionally, second control logic for determining a first set of the plurality of through silicon vias that are nonfunctional, wherein the second control logic is configured to send information to the first control logic identifying the first set of the plurality of through silicon vias or identifying a second set of through silicon vias that are functional. Also a method of sending signals through a plurality of through silicon vias.

16 Claims, 6 Drawing Sheets

(56) References Cited

FOREIGN PATENT DOCUMENTS

| | | | |
|---|---|---|---|
| JP | 2006019328 A | 1/2006 | |
| JP | 2007158237 A | 6/2007 | |
| JP | 2008166832 A | 7/2008 | |
| JP | 2009099683 A | 5/2009 | |
| KR | 20080031094 A | 4/2008 | |
| KR | 20090014631 A | 2/2009 | |
| KR | 20090034785 A | 4/2009 | |
| KR | 20090049442 A | 5/2009 | |
| TW | 200931039 A | 7/2009 | |
| WO | 2007032184 A1 | 3/2007 | |

OTHER PUBLICATIONS

International Search Report and Written Opinion—PCT/US2010/035646, International Search Authority—European Patent Office—Dec. 30, 2010.

Taiwan Search Report—TW099116165—TIPO—Jun. 4, 2013.

* cited by examiner

| X | Y | Z | W | TSV defect checker |
|---|---|---|---|---|
| 1 | DC | DC | DC | All TSVs are fine. |
| 0 | 0 | 0 | 0 | All TSVs are defected. |
| 0 | 0 | 0 | 1 | TSV1 and TSV2 are defected. |
| 0 | 0 | 1 | 0 | TSV1 and TSV3 are defected. |
| 0 | 0 | 1 | 1 | TSV1 is only defected. |
| 0 | 1 | 0 | 0 | TSV2 and TSV3 are defected. |
| 0 | 1 | 0 | 1 | TSV2 is only defected. |
| 0 | 1 | 1 | 0 | TSV3 is only defected. |
| 0 | 1 | 1 | 1 | All TSVs are fine. |

DC: Don't care

METHOD AND APPARATUS FOR PROVIDING THROUGH SILICON VIA (TSV) REDUNDANCY

FIELD OF DISCLOSURE

The disclosed embodiments are directed to a method and apparatus for providing redundant through silicon vias (TSV's) between first and second stacked dies, and, more specifically, toward a method and apparatus for sending signals through specified ones of a plurality of TSV's, such as TSV's that have been determined to be functional.

BACKGROUND

Die stacking involves mounting one or more chips on another chip in a single semiconductor package. This process can increase the amount of circuitry that can be housed within a package of a given size, and thus reduces the real estate taken up on a printed circuit board by a chip. Die stacking may also simplify the assembly of printed circuit boards since multiple dies may be attached to a printed circuit board in a single operation. Die stacking also has the potential to improve the electrical performance of devices in which it is used since the interconnections between elements on each of the stacked dies may be shorter than the interconnections that would be required to connect the die elements on a planar surface. This can result in faster signal propagation and may also reduce cross-talk.

Figure 1:
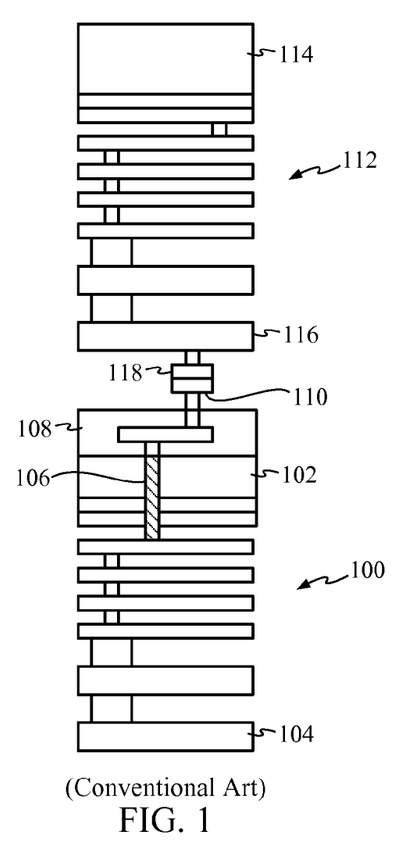
FIG. 1 is a schematic illustration of first and second conventional stacked dies interconnected by a through silicon via (TSV).

Connections may be formed between circuit elements on a first die and circuit elements on a die stacked on the first die by using through silicon vias (TSV's). As the name suggest, a TSV is a conductive via formed through a layer of silicon that provides electrical connections between elements on both sides of the via. A conventional die stacking arrangement using TSV's is illustrated in FIG. 1. A first die 100 includes a substrate 102 on which conventional layers of circuitry are formed and a top metal layer 104. A through silicon via 106 is formed in the substrate 102 by conventional processes, which may involve thinning the substrate to expose an end of the TSV 106, and a redistribution layer 108 is added to the side of the substrate opposite the conventional layers of circuitry. A microbump 110 may be formed on the redistribution layer to provide an electrical connection to the TSV 106. A second die 112 that is to be stacked on the first die 100 includes a substrate 114, a top metal layer 116, and a microbump 118. Electrical connections are formed between the first die 100 and the second die 112 by inverting the second die 112 and connecting the microbump 118 on the second die 112 with the microbump 110 on the first die 100.

Figure 2:
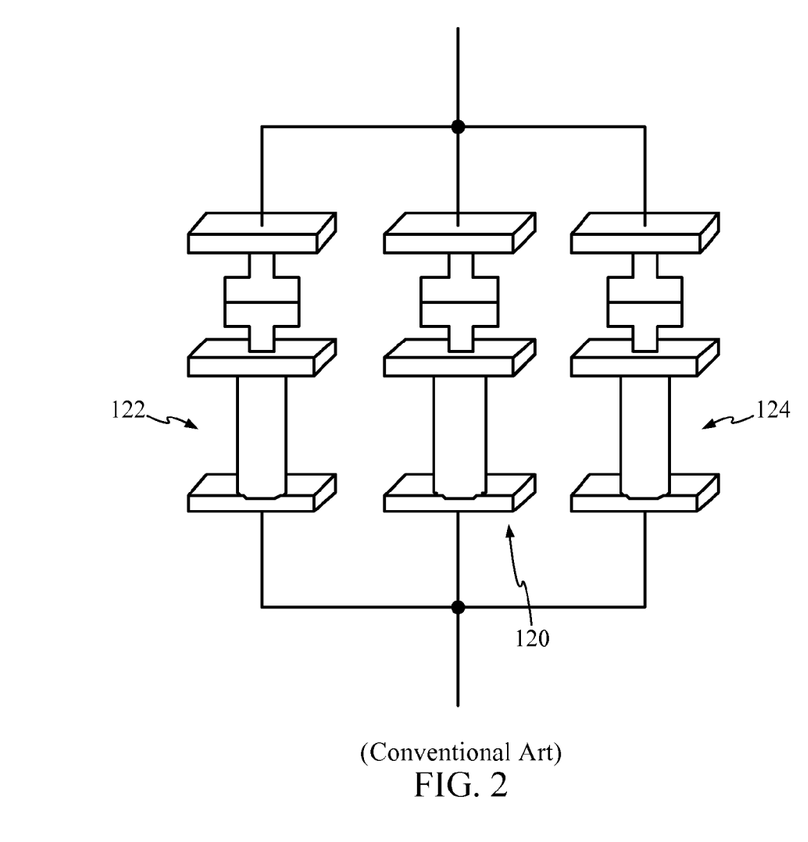
FIG. 2 is a schematic illustration of conventional redundant TSV's.

The above-described arrangement may provide a satisfactory connection between stacked dies. However, it is not uncommon for TSV's to be defective. Defects may arise during the manufacturing process or may occur during use of the device embodying the TSV's. Thus, it is sometimes desirable to provide one or more redundant TSV's in parallel with a primary TSV to help ensure that at least one conductive path will be present even if TSV's are or become inoperative. FIG. 2, for example, illustrates a primary TSV 120 flanked by a first redundant TSV 122 and a second redundant TSV 124 in a conventional manner. As long as at least one of these TSV's is functional, a connection will be maintained. However, providing one or two redundant TSV's for each TSV used increases the amount of space required for connections and may increase the complexity of the dies. It would therefore be desirable to provide a connection between stacked dies using TSV's that does not require two or three redundant TSV's for each required die interconnection.

SUMMARY

Exemplary embodiments are directed to systems and methods for controlling signal transfer through a plurality of through silicon vias. A first aspect comprises an apparatus that includes a first die having a first bus and a second die having a second bus, the second die being stacked on the first die. A plurality of through silicon vias connect the first bus to the second bus, and control logic is provided for sending data to identified ones of the through silicon vias.

Another aspect comprises an apparatus that includes a first die having a first bus and a second die having a second bus, the second die being stacked on the first die. A plurality of through silicon vias connect the first bus to the second bus, and control logic is provided for sending data to identified ones of the through silicon vias. Furthermore, the apparatus includes second control logic for determining that some of the through silicon vias are nonfunctional. This second control logic is configured to send information to the first control logic that identifies the functional vias or the nonfunctional vias.

Yet another aspect comprises an apparatus that includes a first die having a first bus and a second die having a second bus which second die is stacked on the first die. A plurality of through silicon vias connect the first bus to the second bus, and a first mechanism is provided for sending data to identified ones of the through silicon vias.

A further aspect comprises an apparatus that includes a first die having a first bus and a second die having a second bus in which a second die is stacked on the first die. A plurality of through silicon vias connect the first bus to the second bus, and a first mechanism is provided for sending data to identified ones of the through silicon vias. The apparatus also includes a second mechanism for determining that a first set of the through silicon vias are nonfunctional, and this second mechanism is configured to send information to the first mechanism to identify groups of through silicon vias that are functional or nonfunctional.

Another aspect comprises a method that involves providing a first die having a first bus and a second die having a second bus and forming a plurality of through silicon vias to connect the first bus and the second bus. Signals are addressed to specific ones of the through silicon vias, and addressed signals are transmitted from the first bus to the second bus using a through silicon via identified the address of the signal.

A further aspect comprises a method that involves providing a first die having a first bus and a second die having a second bus and forming a plurality of through silicon vias to connect the first bus and the second bus. Signals are addressed to specific ones of the through silicon vias, and addressed signals are transmitted from the first bus to the second bus using a through silicon via identified the address of the signal. In addition, the method involves determining whether any of the plurality of through silicon vias are nonfunctional, and sending data from the first bus to the second bus using only through silicon vias that are functional.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Aspects are disclosed in the following description and related drawings directed to specific embodiments. Alternate embodiments may be devised without departing from the scope of the invention. Additionally, well-known elements will not be described in detail or will be omitted so as not to obscure the relevant details of the disclosed embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the embodiments may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 3:
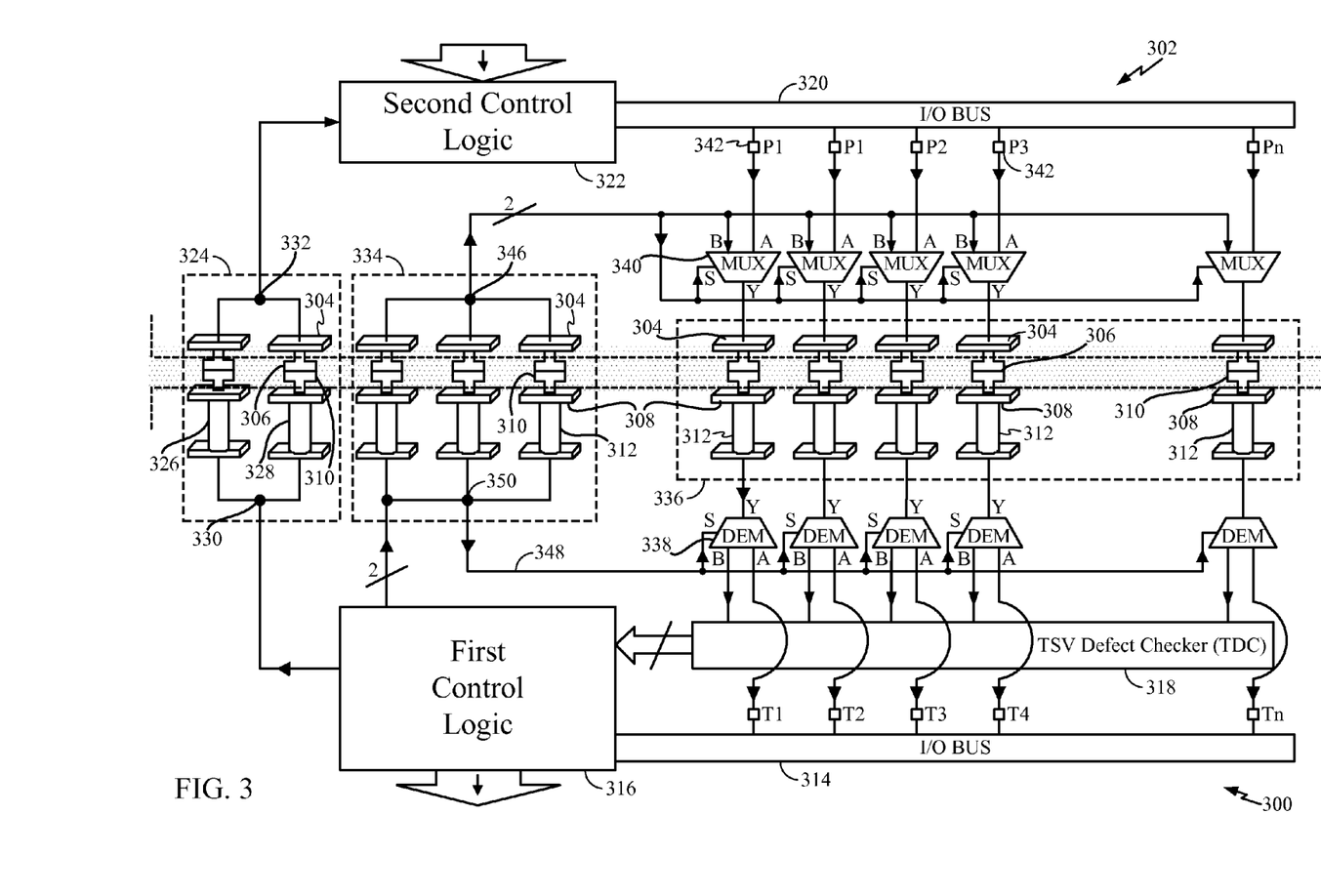
FIG. 3 is a schematic illustration of a plurality of TSV's connecting first and second dies and control logic for controlling pathways between the first and second dies.

With reference to FIG. 3, an arrangement of a first die 300 and a second die 302 stacked on the first die 300 is illustrated. The second die 302 includes a plurality of metal contacts 304 which are electrically connected to circuitry within the second die 302 that will be discussed hereinafter, and a plurality of microbumps 306 that are electrically connected to the metal contacts 304 of the second die 302. The first die 300 also includes metal contacts 308 each having microbumps 310 that connect to the microbumps 306 of the second die 302 for forming an electrical connection between the first die 300 and the second die 302. The metal contacts 308 of the first die 300 are in turn, each connected to a through silicon via (TSV) 312 which forms an electrical connection with circuitry within first die 300. The first die 300 includes a first input/output (I/O) bus 314 connected to first control circuitry or control logic 316, and the TSV defect checker 318 is also in communication with the first control logic 316. The second die 302 includes a second bus 320 and second control circuitry or control logic 322.

The interconnections between first die 300 and second die 302 are arranged in three groups. A first interconnection group 324 includes a first TSV 326 and a second TSV 328 connected in parallel between a first node 330 on the first die 300 and a second node 332 on the second die 302. The first node 330 is connected to the first control logic 316 and the second node 332 is connected to the second control logic 322. The second TSV 328 provides a redundant communication path between the first control logic 316 and the second control logic 322 in a conventional manner. A second interconnection group 334 and third interconnection group 336 are also illustrated and will be described hereinbelow.

The third interconnection group 334 of the TSV's 312 provides pathways for sending signals between the first bus 314 and the second bus 320. A plurality of demultiplexers 338 are connected between the TSV defect checker 318 and the TSV's 312 of the third interconnection group 334, and a plurality of multiplexers 340 are connected between the second bus 320 and the metal contacts 304 of second die 302. A single multiplexer 340 and a single demultiplexer 338 are discussed below, it being understood that the remaining multiplexers 340, demultiplexers 338 and TSV's 312 in the third interconnection group 334 are substantially identical.

Each multiplexer 340 includes a first input A, a second input B, an output Y and a selector input S. The multiplexer 340 outputs Y are connected to the metal contacts 304 of the second die 302. As discussed below, a signal on a selector input S determines whether the signal on input A or the signal on input B will be provided to the output Y. Each demultiplexer 338 includes an input Y connected to a TSV 312 of the third interconnection group 336, a selector input labeled S, a first output A and a second output B. As discussed below, the signal on selector input Y determines whether the signal received at demultiplexer Y is output on first output A or second output B.

Input B of each multiplexer 340 is connected to the second bus 320 via an addressable output 342 labeled P1 . . . Pn in FIG. 3. Each multiplexer input A and selector input S is connected to a second die input line 344 which includes a node 346 connected to second die interconnection group 334. Each first demultiplexer output A and second demultiplexer output B is connected to the TSV defect checker 318. Each selector input S of demultiplexers 338 is connected to a first die input line 348 which includes a node 350 connected to the second die interconnection group 334. First control logic 316 is also connected to the node 350. The second die interconnection group 334 includes three TSV's 312 which provide a redundant connection between the first die 300 and the second die 302 in a conventional manner.

The number of TSV's 312 in the third die interconnection group 336 can be quite large—five hundred or one thousand, for example. If redundancy were provided in a conventional manner, it would be necessary to provide one or two redundant TSV's for each connection resulting in, for example, three thousand TSV's for a case in which one thousand pathways are needed. Such an approach could increase the complexity of the manufacturing process and take up space that could advantageously be used for other circuitry. Therefore, embodiments of the present disclosure contemplate the use of addressable TSV's that transfer signals between the first die 300 and the second die 302 based on an address assigned by second control logic 322. The TSV defect checker 318, described below, determines whether any of the TSV's 312 are defective or have become non-conductive. The TSV defect checker 318 also provides this information to the second control logic 322 via the first control logic 316 and the first TSV die interconnection group 324 so that the second control logic 322 does not use the addresses of the defective or inoperative TSV's 312. Through such use of addressable TSV's, the number of redundant TSV's can be significantly reduced. For example, instead of doubling or tripling the number of desired TSV's to provide redundancy, a thirty to forty percent increase in the number of TSV's in the third TSV die interconnection group 336 will provide sufficient redundancy while conserving real estate on the dies. The testing process by which signals are received at the TSV defect checker 318 is discussed below after which several methods of using such input signals to determine the addresses of inoperative TSV's will be discussed.

Figure 4:
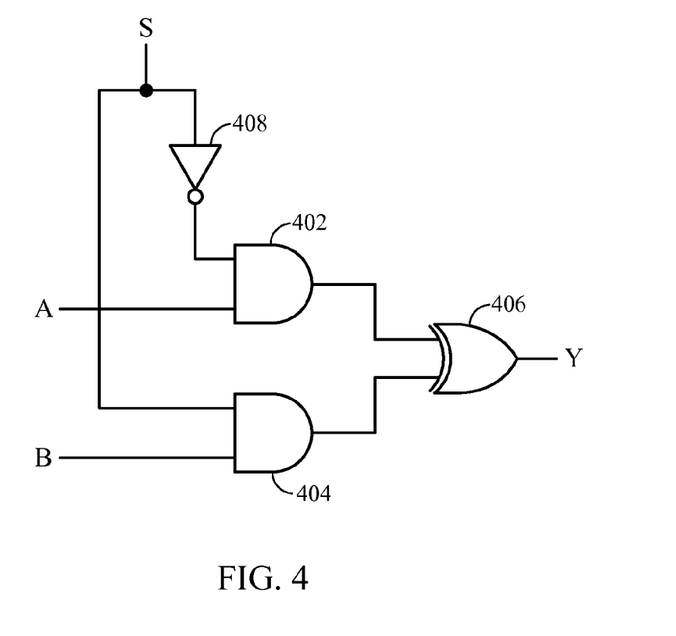
FIG. 4 is a circuit diagram of one of the multiplexers illustrated in FIG. 3.

The internal structure of one of multiplexers 340 is illustrated in FIG. 4. Each multiplexer includes a first AND gate 402, a second AND gate 404 and an exclusive OR (EOR) gate 406. Multiplexer input A is connected to one of the inputs of the first AND gate 402 and multiplexer input B is connected to one of the inputs of the second AND gate 404. Selector signal S is inverted by an inverter 408 and input to the other input of the first AND gate 402 while the uninverted selector signal S is input to the second input of the second AND gate 404. The outputs of the first AND gate 402 and the second AND gate 404 are provided as input to the EOR gate 406. When the signal on selector input S has a first value, low for example, the output of the first AND gate 402 will be the same value as the signal on input A while the output of the second AND gate 404 will be low regardless of the signal on input B. Likewise, when the signal on selector input S is high, the first AND gate 402 will be inoperative and the output of the second AND gate 404 will be the same as the value of the signal on input B. All multiplexers 340 connected to the TSV's 312 in the third die interconnection group 336 are controlled by the signal on the second die input line 344 in a similar manner.

Figure 5:
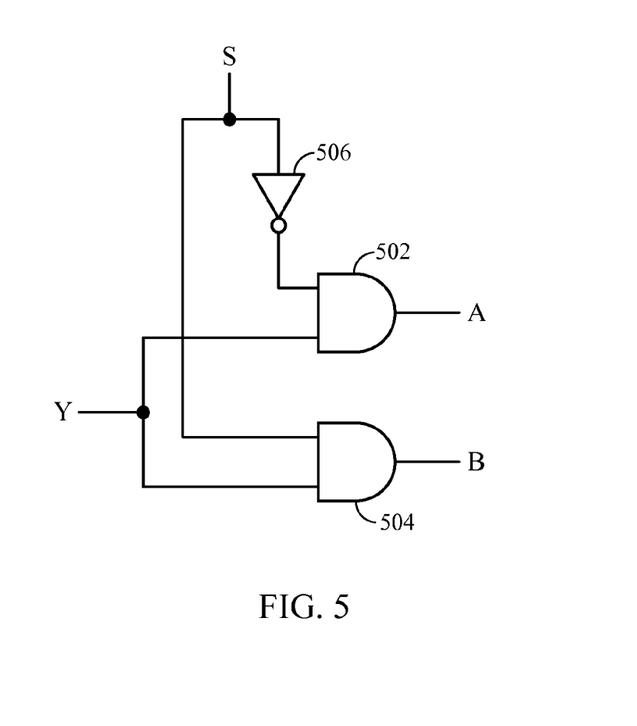
FIG. 5 is a circuit diagram of one of the demultiplexers illustrated in FIG. 3.

The internal structure of the demultiplexers 338 is illustrated in FIG. 5. Each demultiplexer 338 includes a first AND gate 502 and a second AND gate 504. The demultiplexer input Y is connected to one input of each of the first and second AND gates 502, 504. The selector input S is connected directly to an input of the second AND gate 504 and to an input of the first AND gate 502 via an inverter 506. When the signal on a demultiplexer selector input S has a first value, low for example, the output of the second AND gate 504 will be low and the output of the first AND gate 502 will have the logic value of the signal on demultiplexer input Y. When the signal on demultiplexer selector input S has a second value, high, for example, the output of the first AND gate 502 will be low and the output of the second AND gate 504 will have the logic value of the signal on demultiplexer input Y.

Thus, when the first control logic 316 provides a high signal to node 350, the selector input of each multiplexer and each demultiplexer will be high, and the signals input to the first inputs B of the multiplexers 340 will be high, and both the first demultiplexer output A and second demultiplexer output B will be high. These high inputs will be input to the TSV defect checker 318, and if any inputs are low, the TSV from which the low signal came will be considered defective. The address of this defective TSV will be provided to the second control logic 322 so that second control logic 322 will not use this defective TSV for transferring signals between the first and second dies. When the first control logic 316 provides a low signal to the node 350, the signal on multiplexer second inputs A will be output from the demultiplexer second outputs A to the TSV defect checker 318. When the signal on node 350 is low, signals input to each multiplexer input A will be output from a corresponding demultiplexer output A.

The TSV defect checker 318 can operate in various manners to provide information to the first control logic regarding the operating state of each of the TSV's 312 of the third die interconnection group 336. For example, in order to perform a check of the TSV's 312, the TSV checker 318 instructs the first control logic 316 to instruct the second control logic 322 to send a high logic signal to each of the addressable outputs P1 . . . Pn on the second bus 320. If all the TSV's 312 are operational, this should produce a logic high signal on every input to the TSV defect checker 318. Any input signals that are not high indicate that the TSV connected to the TSV defect checker 318 at that location is defective. With this information, the first control logic 316 sends to the second control logic 322 information regarding the addresses of the inoperative TSV's 312, the operative TSV's 312, or both, and from this information, the second control logic 322 determines which addresses to use when transferring data between the first and second dies.

Figure 6:
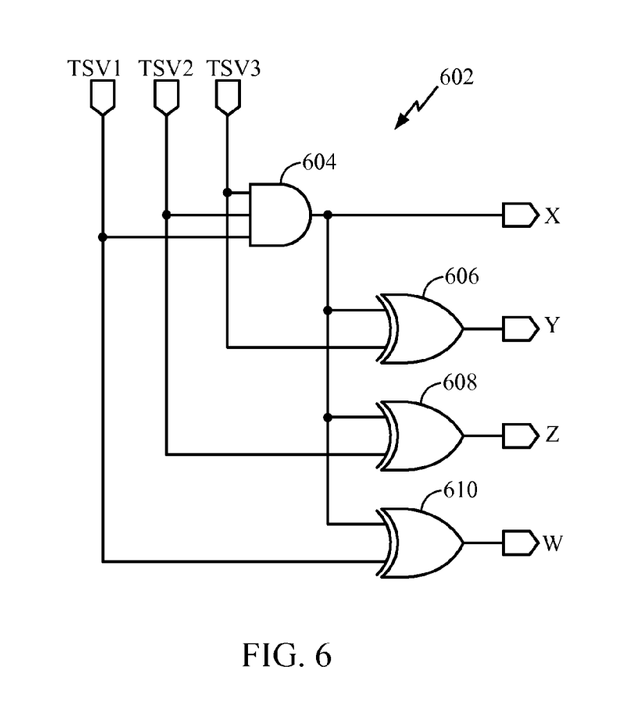
FIG. 6 is a circuit diagram showing the outputs of three TSV's connected to logic circuitry for determining whether any of the TSV's are defective.

Instead of checking the individual outputs of each of the TSV's 312 in third die interconnection group 336, a logic circuit can be used to provide a single output that describes the operating state of each of the TSV's, and this data can be transmitted from second control logic 322 to first control logic 316 for use in assigning addresses. A suitable determining circuit 602 for producing an output based on inputs from three TSV's 312 is illustrated; it will be apparent to those of ordinary skill in the art that such a circuit could easily be configured to accept hundreds of TSV inputs and provide an output indicative of the condition of each of the TSV's.

Figure 7:
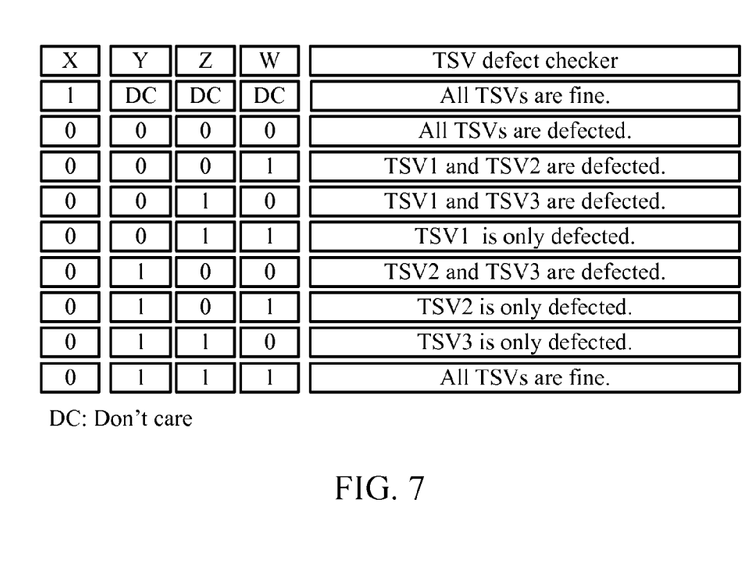
FIG. 7 is a table illustrating possible outputs of the logic circuitry of FIG. 6.

Logic circuit 602 includes a first AND gate 604 having three inputs, and the output of this AND gate 604 is designated output X. Output X is provided as in input to a first EOR gate 606 having an output Y, a second EOR gate 608 having an output Z, and a third EOR gate 610 having an output W. Meanwhile, the signals output from each of the TSV's (designated TSV1, TSV2 and TSV3 in this figure) are provided as inputs to the first AND gate 604 and to each of first, second and third EOR gates 606, 608, 610. The table of FIG. 7 illustrates various combinations of outputs that may be detected at outputs X, Y, Z and W.

Output X will only by high when all inputs to first AND gate 604 are high. Such a high logic signal indicates that all TSV's connected to first AND gate 604 are operative (other than any particular TSV's that were previously found to be permanently outputting a high signal when the input to the multiplexer selector inputs S was low). In this situation, no further analysis is needed, and first control logic 316 informs second control logic 322 of the addresses of the operative and/or inoperative TSV's. However, if output X of logic circuit 602 is low, at least one of the TSV's 312 is inoperative. Because the low output of the first AND gate 602 is input to each of the first, second and third EOR gates 606, 608, the outputs Y, Z, W, respectively, of the EOR gates will only be high if the second input to that EOR gate is high. Thus, if the output of TSV1 is low for example, the output Y of logic circuit 602 will be low, and this information indicates a defect in TSV1. The table of FIG. 7 illustrates other possible combinations of logic circuit outputs where a low logic signal indicates that the TSV connected directly to the EOR gate producing the low output is defective.

The TSV defect checker 318 can be used at the power up of a device in which the first and second dies are used, which may be for example, but without limitation, a memory element, a set top box, a music player, a video player, an entertainment unit, a navigation device, a communications device, a personal digital assistant (PDA), a fixed location data unit, or a computer. The second control logic 322 will thus be provided at each power up with a list of operative TSV addresses, inoperative TSV addresses or both. In addition, periodic tests can be run to provide the second control logic 322 with a list of operative or inoperative TSV's, and, in addition, TSV defect checker 318 can be used to test the TSV's upon the occurrence of various error conditions that suggest a problem with one or more of the TSV's 312. When a TSV 312 is determined to be inoperative, the second control logic 322 will stop using that particular TSV 312 for transferring signals between the first and second dies and will select an unused TSV for further data transfer. In this manner, by adding a relatively small percentage of redundant TSV's, thirty to forty percent, for example, the convention method of providing two hundred to three hundred percent redundancy can be avoided while maintaining similar quality levels. And, as TSV manufacturing processes improve, the number of redundant TSV's can be reduced even further based on the expect defect rate in the TSV's.

Figure 8:
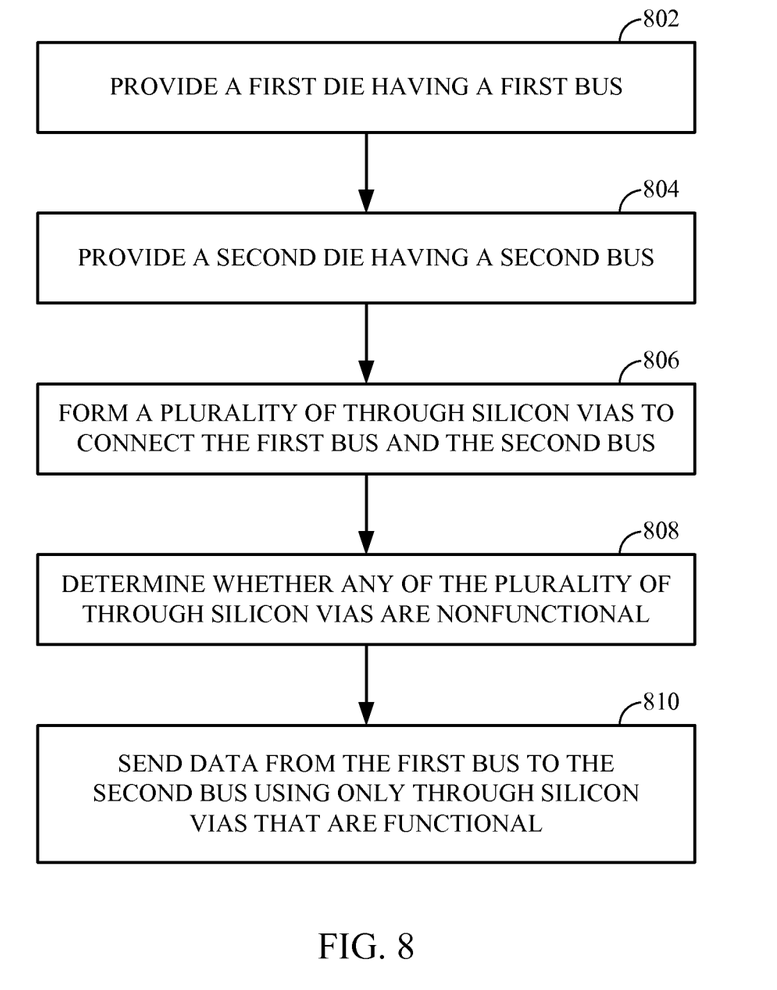
FIG. 8 is a flow chart illustrating a method of sending signals from a first die to a second die using TSV's.

FIG. 8 illustrates a method that includes a block 802 of providing a first die having a first bus, a block 804 of providing a second die having a second bus, and a block 806 of forming a plurality of through silicon vias to connect the first bus to the second bus. The method also includes a block 808 of determining whether any of the plurality of through silicon vias are nonfunctional and a block 810 of sending data from the first bus to the second bus using only through silicon vias that are functional.

Figure 9:
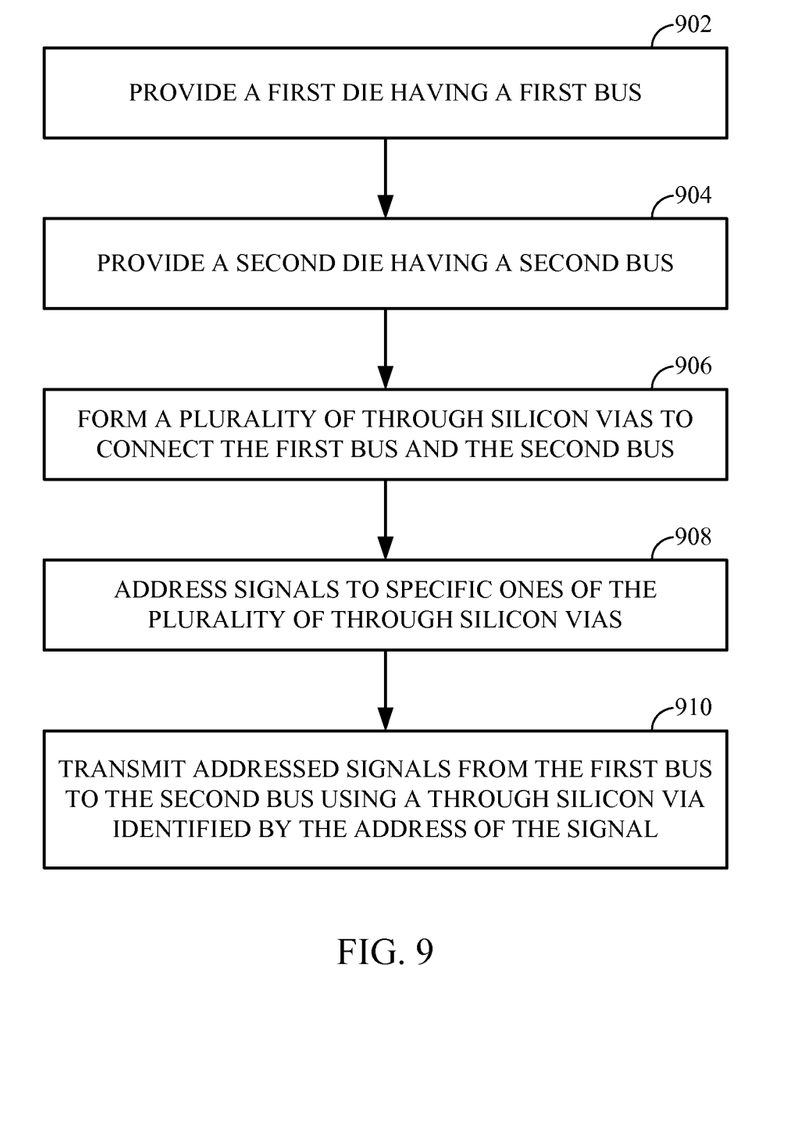
FIG. 9 is a flow chart illustrating another method of sending signals from a first die to a second die using TSV's.

FIG. 9 illustrates another method that includes a block 902 of providing a first die having a first bus, a block 904 of providing a second die having a second bus, and a block 906 of forming a plurality of through silicon vias to connect the first bus to the second bus. The method also includes a block 908 of addressing signals to specific ones of the plurality of through silicon vias and a block 910 of transmitting addressed signals from the first bus to the second bus using a through silicon via identified the address of the signal.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the invention.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM, a solid state memory device, such as a flash-drive, or other optical disk storage, magnetic disk storage or other magnetic storage devices, or any other medium that can be used to carry or store desired program code in the form of instructions or data structures and that can be accessed by a computer. Also, any connection is properly termed a computer-readable medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

It will be appreciated that dies having buses connected by vias as illustrated for example in FIGS. 3-7 may be included within a mobile phone, portable computer, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes such buses and vias.

The foregoing disclosed devices and methods may be designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Accordingly, embodiments can include machine-readable media or computer-readable media embodying instructions which when executed by a processor transform the processor and any other cooperating elements into a machine for performing the functionalities described herein as provided for by the instructions. Accordingly, the scope of the invention is not limited to illustrated examples and any means for performing the functionality described herein are included in embodiments.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of embodiments may be described or claimed in the singular, the plural is contemplated unless limitation to the singular is explicitly stated.

What is claimed is:

1. An apparatus comprising:
   a first die having a first bus, a plurality of demultiplexers, a defect checker, and a first control logic;
   a second die stacked on the first die, said second die having a second bus, a plurality of multiplexers, and a second control logic;
   a plurality of signal through silicon vias, each of said plurality of signal through silicon vias being connected to a respective one of said plurality of demultiplexers and a respective one of said plurality of multiplexers;
   a first plurality of control through silicon vias, each of said first plurality of control through silicon vias being connected to said first control logic and said second control logic; and
   a second plurality of control through silicon vias, each of said second plurality of control through silicon vias connected to said first control logic and each of said plurality of multiplexers to provide a control input to each of said plurality of multiplexers;
   wherein said first bus is connected to said defect checker and said plurality of demultiplexers; and
   said defect checker is connected to said plurality of demultiplexers for receiving an input from each of said plurality of demultiplexers and connected to said first control logic for sending an input to said first control logic.

2. The apparatus of claim 1 wherein said second control logic provides information to said first control logic identifying a subset of the plurality of signal through silicon vias.

3. The apparatus of claim 1
   wherein said second control logic is configured to send information to said first control logic identifying a first set of said plurality of signal through silicon vias or identifying a second set of signal through silicon vias that are functional.

4. The apparatus of claim 3 wherein said first control logic is configured to send data only to functional through silicon vias.

5. The apparatus of claim 3 wherein said second control logic includes a circuit configured to produce a first output when all signal through silicon vias connected to the circuit are functional and a second output different than said first output when at least one signal through silicon via connected to the circuit is defective.

6. The apparatus of claim 3 wherein said second control logic includes a plurality of circuit elements connected to said plurality of signal through silicon vias, a given circuit element associated with a given one of the plurality of signal through silicon vias being configured to produce a first output when the signal through silicon via connected to said given circuit element is functional and a second output different than said first output when the signal through silicon via connected to said given circuit element is nonfunctional.

7. The apparatus of claim 3 integrated into at least one memory element.

8. The apparatus of claim 3 further including a device, selected from the group consisting of a set top box, music player, video player, entertainment unit, navigation device, communications device, personal digital assistant (PDA), fixed location data unit, and a computer, into which the apparatus is integrated.

9. An apparatus comprising:
   a first die having a first bus, a plurality of demultiplexers, a defect checker, and a first control means;
   a second die stacked on the first die, said second die having a second bus, a plurality of multiplexers, and a second control means;
   a plurality of signal through silicon vias, each of said plurality of signal through silicon vias being connected to a respective one of said plurality of demultiplexers and a respective one of said plurality of multiplexers;
   a first plurality of control through silicon vias, each of said first plurality of control through silicon vias being connected to said first control means and said second control means; and
   a second plurality of control through silicon vias, each of said second plurality of control through silicon vias connected to said first control means and each of said plurality of multiplexers to provide a control input to each of said plurality of multiplexers;
   wherein said first bus is connected to said defect checker and said plurality of demultiplexers; and
   said defect checker is connected to said plurality of demultiplexers for receiving an input from each of said plurality of demultiplexers and connected to said first control means for sending an input to said first control means.

10. The apparatus of claim 9 wherein said second control means providing information to said first control means for identifying a subset of the plurality of signal through silicon vias.

11. The apparatus of claim 9
    wherein said second control means is configured to send information to said first control means for identifying the first set of said plurality of signal through silicon vias or identifying a second set of signal through silicon vias that are functional.

12. The apparatus of claim 11 wherein said first control means is configured to send data only to functional signal through silicon vias.

13. The apparatus of claim 11 wherein said second control means includes circuit means configured to produce a first output when all through silicon vias connected to the circuit means are functional.

14. The apparatus of claim 11 wherein said second control means includes a plurality of circuit means connected to said plurality of signal through silicon vias, a given circuit means associated with a given one of the plurality of signal through silicon vias being configured to produce a first output when the signal through silicon via connected to said given circuit means is functional and a second output different than said first output when the signal through silicon via connected to said given circuit means is nonfunctional.

15. The apparatus of claim 11 integrated into at least one memory element.

16. The apparatus of claim 11 further including a device, selected from the group consisting of a set top box, music player, video player, entertainment unit, navigation device, communications device, personal digital assistant (PDA), fixed location data unit, and a computer, into which the apparatus is integrated.

* * * * *